(12) United States Patent
Dogruoz et al.

(10) Patent No.: US 12,426,212 B2
(45) Date of Patent: Sep. 23, 2025

(54) COMBINED LIQUID AND AIR COOLING SYSTEM FOR FAIL-SAFE OPERATION OF HIGH POWER DENSITY ASIC DEVICES

(71) Applicant: Cisco Technology, Inc., San Jose, CA (US)

(72) Inventors: M. Baris Dogruoz, Santa Clara, CA (US); Joel Goergen, Soulsbyville, CA (US)

(73) Assignee: CISCO TECHNOLOGY, INC., San Jose, CA (US)

(*) Notice: Subject to any disclaimer, the term of this patent is extended or adjusted under 35 U.S.C. 154(b) by 446 days.

(21) Appl. No.: 17/720,436

(22) Filed: Apr. 14, 2022

(65) Prior Publication Data

US 2022/0240419 A1 Jul. 28, 2022

Related U.S. Application Data

(63) Continuation of application No. 16/697,463, filed on Nov. 27, 2019, now Pat. No. 11,343,945.

(60) Provisional application No. 62/913,381, filed on Oct. 10, 2019.

(51) Int. Cl.
*H05K 7/20* (2006.01)
*H05K 1/02* (2006.01)

(52) U.S. Cl.
CPC ....... *H05K 7/20509* (2013.01); *H05K 1/0209* (2013.01); *H05K 7/20154* (2013.01); *H05K 7/20254* (2013.01); *H05K 2201/064* (2013.01)

(58) Field of Classification Search
CPC .......... H05K 7/20509; H05K 7/20154; H05K 7/20254; H05K 1/209; H05K 2209/064; H05K 2209/066; H05K 1/0209; H05K 2201/064; H05K 2201/066
USPC ................................................. 361/690, 699
See application file for complete search history.

(56) References Cited

U.S. PATENT DOCUMENTS

| | | | |
|---|---|---|---|
| 5,751,062 A | 5/1998 | Daikoku et al. | |
| 6,625,025 B1 | 9/2003 | Duxbury et al. | |
| 6,662,136 B2* | 12/2003 | Lamb ..................... | H01L 23/34 |
| | | | 374/E7.042 |
| 9,436,235 B2 | 9/2016 | Damaraju et al. | |

(Continued)

FOREIGN PATENT DOCUMENTS

CN 206094653 U 4/2017

*Primary Examiner* — Marc E Norman
(74) *Attorney, Agent, or Firm* — Edell, Shapiro & Finnan, LLC

(57) ABSTRACT

A combined liquid and air cooling system is provided over a printed circuit board (PCB) of an electronic device, where the PCB includes an integrated circuit package including an application specific integrated circuit (ASIC) die and a plurality of high bandwidth memory (HBM) modules located proximate the ASIC die, and the combined liquid and air cooling system includes a liquid cooling system located over the integrated circuit package and an air cooling system integrated with the liquid cooling system and a portion of the PCB. The system operates in a normal mode, where both liquid and air cooling systems provide cooling to components of the PCB, and a fail-safe mode, where the liquid cooling system is not operating (e.g., due to a detected condition) but the air cooling system operation is adjusted such that it provides sufficient cooling to PCB components which facilitates continuous operation of the electronic device.

20 Claims, 10 Drawing Sheets

(56) References Cited

U.S. PATENT DOCUMENTS

| | | |
|---|---|---|
| 10,032,695 B2 | 7/2018 | Iyengar et al. |
| 10,153,261 B2 | 12/2018 | Dogruoz et al. |
| 2002/0021556 A1 | 2/2002 | Dibene, II et al. |
| 2005/0011635 A1 | 1/2005 | Liu et al. |
| 2005/0180113 A1* | 8/2005 | Shirakami ........... F28D 15/0233 |
| | | 257/E23.09 |
| 2006/0133039 A1* | 6/2006 | Belady ................. H01L 23/473 |
| | | 165/80.4 |
| 2006/0196640 A1 | 9/2006 | Siu |
| 2010/0128436 A1 | 5/2010 | Edmunds et al. |
| 2013/0216242 A1* | 8/2013 | Iijima ................... G03G 15/55 |
| | | 399/9 |
| 2014/0015106 A1 | 1/2014 | Hsieh et al. |
| 2016/0120063 A1 | 4/2016 | Cheng et al. |
| 2017/0221793 A1 | 8/2017 | Smalley et al. |
| 2019/0200479 A1 | 6/2019 | Yatskov et al. |
| 2019/0237371 A1 | 8/2019 | Ahmad et al. |
| 2020/0357721 A1* | 11/2020 | Sankman ............ H01L 25/0655 |
| 2020/0378858 A1* | 12/2020 | Curtis ....................... F17D 5/06 |

* cited by examiner

COMBINED LIQUID AND AIR COOLING SYSTEM FOR FAIL-SAFE OPERATION OF HIGH POWER DENSITY ASIC DEVICES

CROSS REFERENCE TO RELATED APPLICATION

This application is a continuation of U.S. patent application Ser. No. 16/697,463, entitled "A Combined Liquid and Air Cooling System for Fail-Safe Operation of High Power Density ASIC Devices", filed Nov. 27, 2019, which claims priority under 35 U.S.C. § 119(e) to U.S. Provisional Patent Application Ser. No. 62/913,381, entitled "Combined Liquid Cooling and Air Cooling of High Power Density ASIC", filed Oct. 10, 2019, the disclosures of which are incorporated herein by reference in their entireties for all purposes.

TECHNICAL FIELD

The present disclosure relates to cooling of high power density ASIC devices.

BACKGROUND

With increasing networking speeds associated with electronic devices, there is a corresponding increase in power consumption associated with printed circuit board (PCB) components such as the Application Specific Integrated Circuit (ASIC) and other modules (e.g., optical modules, memory modules, etc.). Ensuring adequate thermal management of these components can become critical to achieve efficient operation for long periods of time. In addition, the form factor of such components (e.g., die size) tends to remain nearly unchanged while the density of structures on such components can increase. While air cooling methods are typically used to address ASIC cooling issues, the heat carrying capacity of air and system airflows may not be sufficient to properly cool the main die(s) and/or other devices on the ASIC or the PCB. Further, in cooling 2.5 D ASIC configurations, certain memory structures (e.g., High Bandwidth Memory (HBM) structures) can present a bottleneck to achieving adequate cooling using only air. Maximum allowable temperatures for HBM structures are typically 10-20° C. lower than the maximum temperatures allowed for the main die. Further, if the HBM total power exceeds about 8 W-9 W, a long term cooling solution using only air is not plausible. Liquid cooling systems can be utilized as a remedy to the aforementioned issues. However, if a liquid cooling system for a high power density ASIC fails during operation, this can present a significant problem.

DESCRIPTION OF EXAMPLE EMBODIMENTS

Overview

Figure 1:
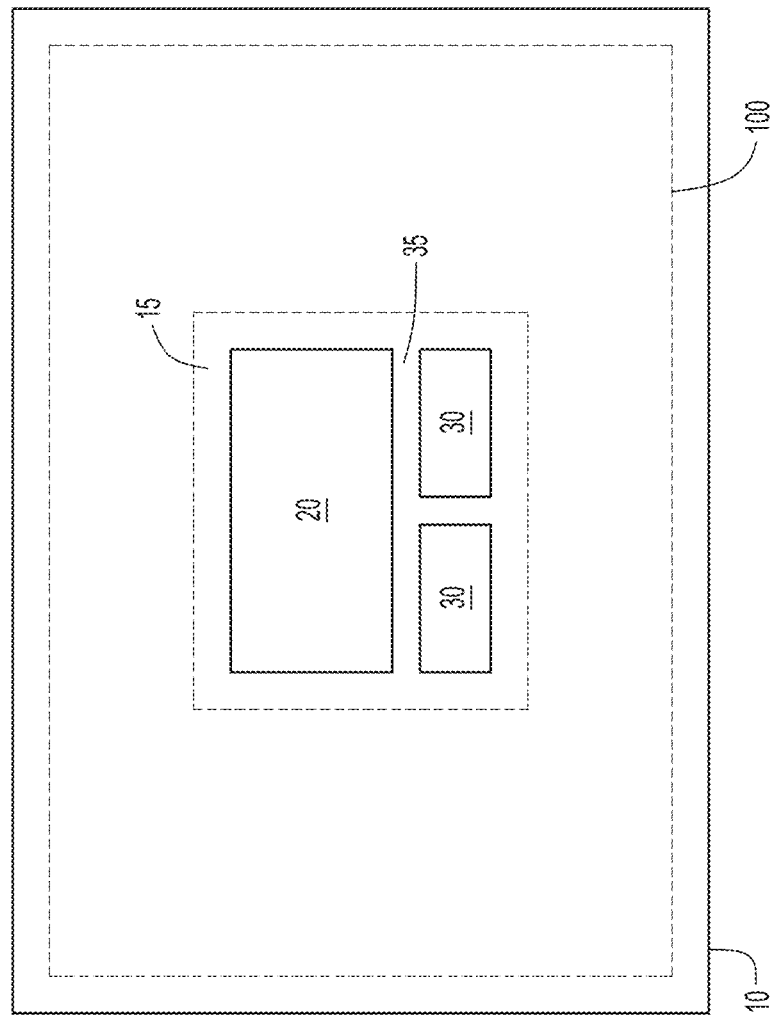
FIG. 1 is a schematic top view of a high density ASIC device that utilizes a combined liquid and air cooling system in accordance with embodiments described herein.

In an embodiment, an apparatus comprises an integrated circuit package comprising a plurality of components including an application specific integrated circuit (ASIC) die and a plurality of high bandwidth memory (HBM) modules located proximate the ASIC die. The apparatus further comprises a combined liquid and air cooling system to cool components of the integrated circuit package. The combined liquid and air cooling system comprises a liquid cooling system comprising a cold plate located over the ASIC die and the HBM modules, where the liquid cooling system further comprises a closed recirculation loop that circulates a coolant fluid through the cold plate to provide cooling to the ASIC die and HBM modules. The combined liquid and air cooling system further comprises an air cooling system integrated with the liquid cooling system, where the air cooling system comprises a heat sink and an airflow device that directs a flow of air through the heat sink to cool components of the integrated circuit package.

In another embodiment, an electronic device comprises a printed circuit board (PCB), the integrated circuit package integrated with the PCB, and the combined liquid and air cooling system.

In a further embodiment a method comprises providing a combined liquid and air cooling system over a printed circuit board (PCB) of an electronic device, the PCB including a plurality of components including an integrated circuit package, where the integrated circuit package comprises an Application Specific Integrated Circuit (ASIC) die and a plurality of High Bandwidth Memory (HBM) modules located proximate the ASIC die, and the combined liquid and air cooling system comprises a liquid cooling system located over the integrated circuit package and an air cooling system integrated with the liquid cooling system and a portion of the PCB. In a first mode of operation, a flow of a coolant fluid is provided within a closed recirculation loop and through a cold plate of the liquid cooling system to cool the ASIC die and HBM modules of the integrated circuit package during operation of the electronic device, and a flow of air is directed via an airflow device of the air cooling system at a first flow rate through a heat sink of the air cooling system to cool components of the PCB.

Example Embodiments

An effective and fail-safe cooling system for an electronic device is described herein that provides combined liquid and air cooling to a printed circuit board (PCB) that includes a high power density integrated circuit (IC) package, such as an IC package that includes an application specific integrated circuit (ASIC) die and one or more high bandwidth memory (HBM) modules. The IC package and combined liquid and air cooling system are supported on the PCB. The liquid cooling portion/system of the fail-safe cooling system comprises a cold plate that is located in close proximity with the package (e.g., the cold plate is disposed directly over the IC package lid) and provides liquid cooling for the IC package utilizing a plurality of cooling zones in fluid communication with each other. The cold plate is structured to receive a coolant fluid that flows via an inlet into the cold plate, consecutively through each cooling zone, and then through an outlet to exit the cold plate. Each cooling zone includes a plurality of cooling fins, and each cooling zone can be physically separated from an adjacent cooling zone. Further, two or more cooling zones can have varying cooling fin densities (as determined, e.g., by number of fins per inch or FPI). The air cooling portion/system of the fail-safe system is integrated with the liquid cooling system and comprises a primary heat sink and secondary heat sink that are disposed in close proximity with the cold plate such that the cold plate is located or "sandwiched" between the IC package and the heat sinks. The primary and secondary heat sinks are also physically separated or spaced from each other (i.e., the secondary heat sink and primary heat sink are not in contact with each other), where each heat sink includes cooling fins and one or more fans are provided to direct air across the cooling fins so as to provide air cooling for electronic components of the IC package as well as other electronic components on the PCB.

The fail-safe cooling system operates in two modes to provide effective cooling for electronic components within the IC package as well as other electronic components of the PCB. During a first or normal mode of operation, liquid cooling by the cold plate of the liquid cooling system is provided to the IC package while air cooling is provided to the IC package and/or other components of the PCB by an airflow device (e.g., one or more fans) of the air cooling system that directs air across cooling fins of the primary and secondary heat sinks. In the normal mode, the airflow device is operated at a first operational speed (e.g., a first operational or fan speed of less than 100%, such as less than about 30%) that provides a first rate of airflow. In a second or fail-safe mode of operation, a condition is detected such as a leak in the liquid cooling system (e.g., in the cold plate, the pump and/or a coolant fluid recirculation loop of the liquid cooling system), and the liquid cooling is stopped or prevented (to facilitate repair of the leak) while air cooling by the air cooling system is increased (by increasing airflow as described herein) so as to provide adequate cooling for both the IC package as well as other components of the PCB. In the fail-safe mode, coolant fluid is prevented from flowing through the cold plate, and the airflow device is operated at a second operational speed that is greater than the first operational speed (e.g., a second operational or fan speed that is greater than about 30%, such as 100%) so as to provide a second rate of air flow that is greater than the first rate of airflow. This second rate of airflow provides adequate cooling for both the IC package as well as other components of the PCB. The fail-safe mode of operation is continued until a determination is made that the liquid cooling portion that was leaking (e.g., conduits, connection members, fixtures, and/or any other types of fluid plumbing within the coolant fluid recirculation loop) has been repaired/replaced, and therefore is no longer leaking coolant fluid. When such determination has been made, the mode of operation switches or reverts back to the normal operation mode including combined liquid and air cooling for the IC package and other components of the PCB.

While the fail-safe mode of operation is not as effective at cooling the IC package as the normal mode of operation during PCB operations, it is still able to maintain a temperature of the IC package that is within an acceptable tolerance level (i.e., at or below the short-term allowable temperature limits of the ASIC). Therefore, the fail-safe mode of operation maintains continuous operation of the PCB while the liquid cooling portion of the system is being repaired.

Referring to FIGS. 1-5, an example embodiment is depicted of an electronic apparatus or device 2 that includes a PCB 10 with electronic components disposed thereon and/or integrated with the PCB. The device 2 can comprise, e.g., a line card for network operations, a graphics card or any other type of device incorporating HBM structures with an ASIC.

As schematically depicted in FIG. 1, an IC package 15 is disposed on and integrated with the PCB 10 of the device 2, where the IC package includes one or more ASIC dies, including a DIE 20 and a plurality of HBM modules 30 disposed in a side-by-side and/or tandem arrangement. The DIE 20 (also referred to as an ASIC die) comprises a semiconductor material and includes one or more electrical circuits and other components integrated with the DIE that form at least part of and perform operations of the ASIC. The plurality of HBM modules 30 can include a first HBM module (also referred to as HBM-1) and a second HBM module (also referred to as HBM-2). Each of the DIE 20 and HBM modules 30 can be formed in any suitable manner on a substrate with any suitable types of materials and include any suitable number of logic layers within the substrate including vias, conductive traces, interposers, etc. to facilitate suitable operations for a particular application associated with the device. A package lid 40 (FIG. 3B) is disposed over the DIE 20 and HBM modules 30 to seal the components within the package 15. The package lid 40 can be formed of copper or any other suitable thermally conductive material and have a suitable thickness (e.g., about 15 mm) to facilitate effective heat transfer from the IC package 15. A fail-safe cooling system 100 as described herein is disposed directly over the IC package 15 (e.g., in contact with the package lid 40) to facilitate cooling of the DIE 20 and HBM modules 30 of the IC package 15 as well as other components integrated with the PCB 10 during operation of the device 2.

Figure 3A:
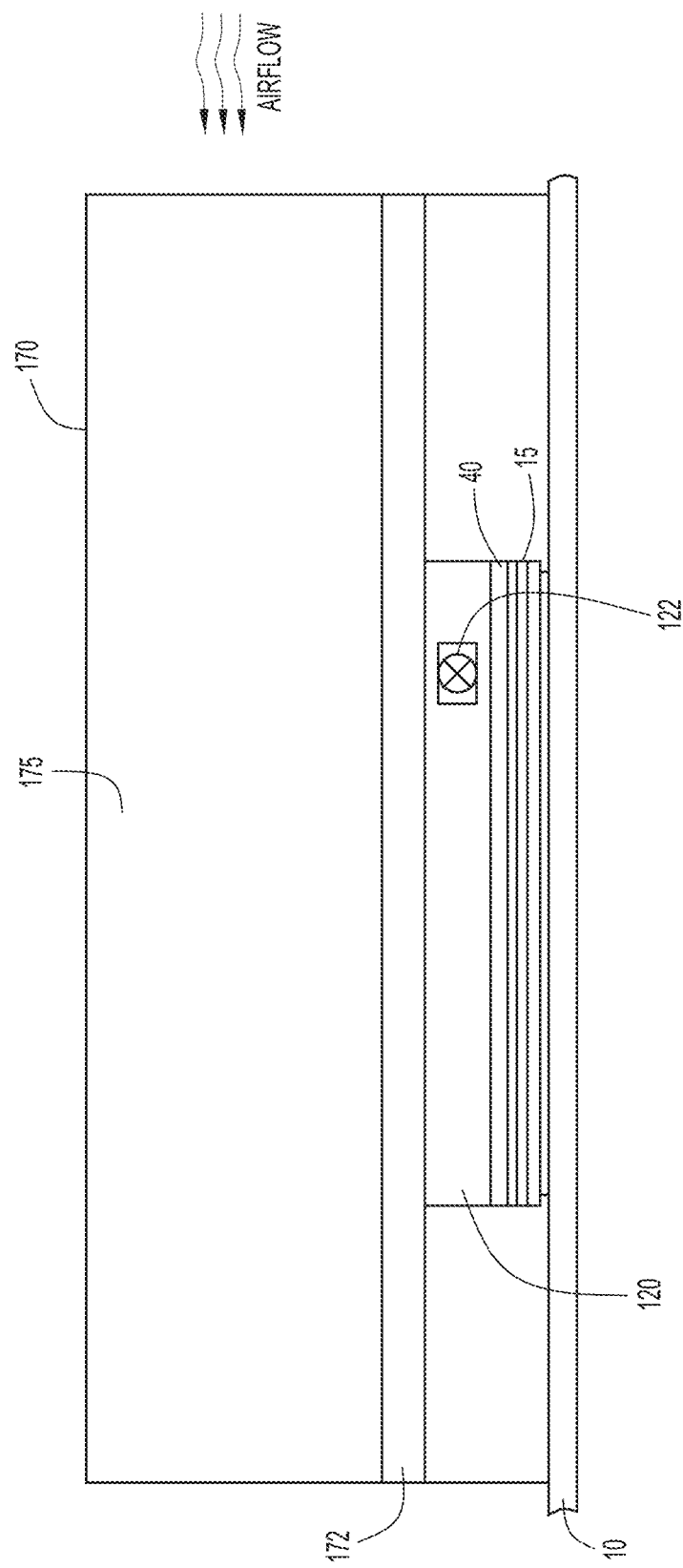
FIG. 3A is a side view in partial cross-section of a portion of the device of FIG. 2 taken along lines 3A-3A.
Figure 3B:
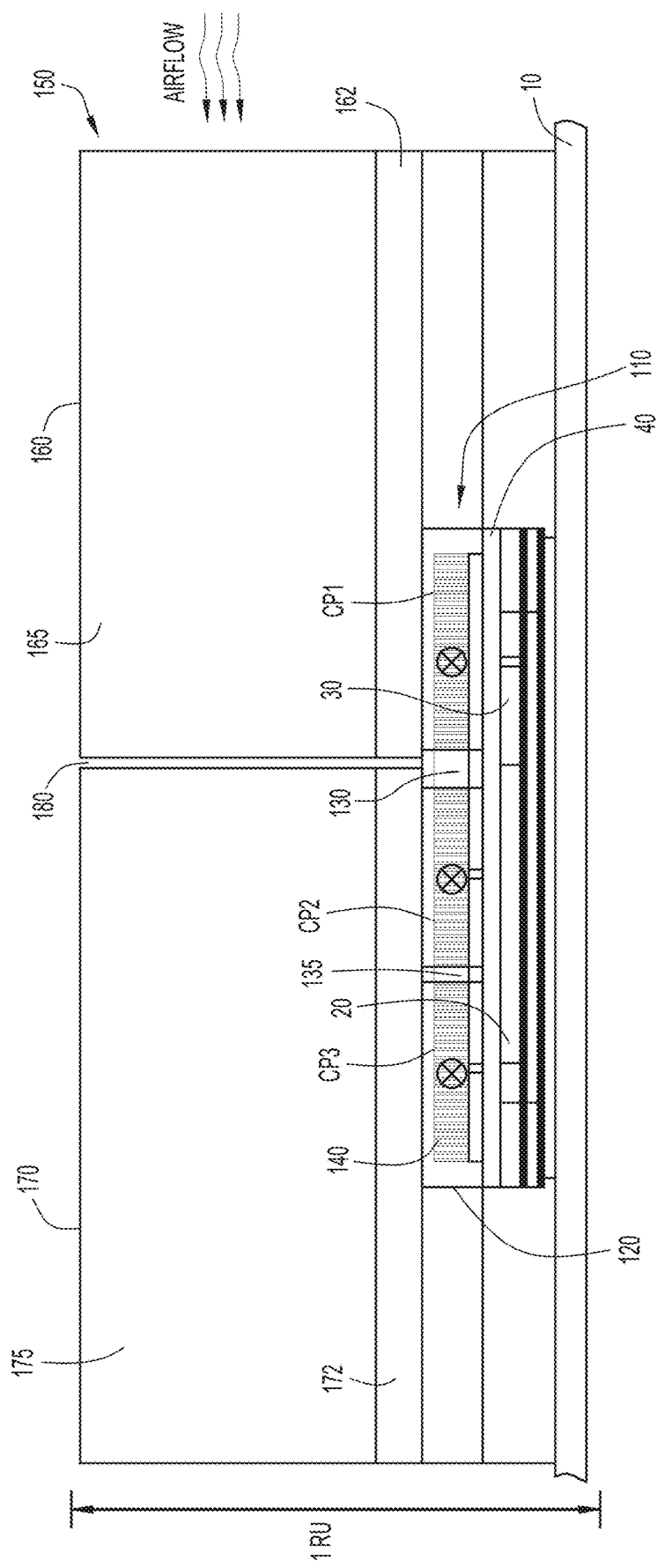
FIG. 3B is a side view in partial cross-section of a portion of the device of FIG. 2 taken along lines 3B-3B.
Figure 3C:
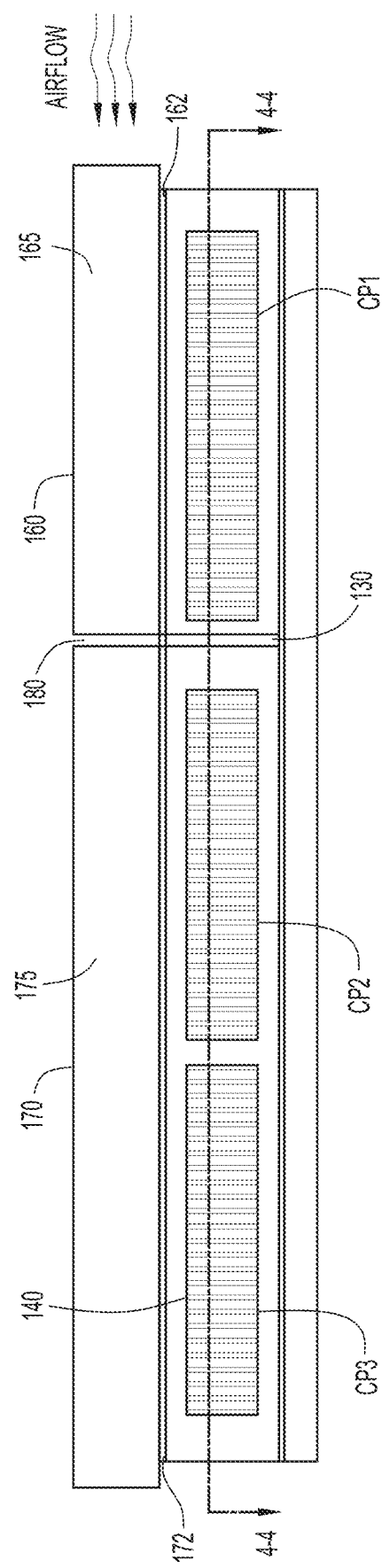
FIG. 3C is a side view in partial cross-section of a portion of the device of FIG. 2 taken along lines 3C-3C.

The fail-safe cooling system 100 comprises a liquid cooling component or liquid cooling system 110 and an air cooling component or air cooling system 150 that operate together to achieve effective cooling of the DIE 20, HBM modules 30 as well as other components of PCB 10 during operations of the device 2 under a variety of conditions. As shown in FIGS. 3A-3C, the liquid and air cooling systems are oriented in a vertically stacked arrangement, with the liquid cooling system 110 being positioned directly over the IC package 15, and the air cooling system 150 being positioned directly over the liquid cooling system 110 (and therefore also over the IC package 15). The liquid cooling system 110 is sized having an area that covers the area or footprint of the IC package 15. The air cooling system 150 is larger in area than the liquid cooling system 110. The liquid and air cooling systems are suitably dimensioned such that a height dimension of the entire electronic device including housing with the fail-safe cooling system 100 disposed therein does not exceed a rack unit (i.e., device height no greater than 1 RU, as shown in FIG. 3B). For example, the liquid and air cooling system can be suitably dimensioned such that the overall assembly dimension of the device incorporating a PCB with such liquid and air cooling system does not exceed length by width by height dimensions of 203 mm×35.5 mm×110 mm (8 inch×1.4 inch×4.1 inch). Maintaining dimensions within these limits facilitates placement of two of PCB assemblies side by side in a 1 RU line card.

As described in further detail herein, the liquid cooling system 110 comprises a cold plate 120 that is disposed directly over the IC package 15, where a thermal interface material (TIM) layer can be disposed between the cold plate 120 and package lid 40. The air cooling system 150 (also described in further detail herein) comprises a plurality of heat sinks 160, 170 that are disposed directly over the liquid cooling system 110, where a suitable TIM layer can be disposed between the cold plate 120 and the heat sinks 160, 170. Thus, the cold plate 120 is disposed in a vertical alignment or sandwiched between the IC package 15 and the heat sinks 160, 170 (where a TIM layer can be disposed at the interface between cold plate and heat sinks and also between cold plate and IC package).

The cold plate 120 of the liquid cooling system 110 comprises a hollow enclosure or housing that includes a plurality of enclosed and segregated or separate cooling zones or cold plate zones that are structured and arranged to receive a coolant fluid at an inlet of the cold plate and pass the coolant fluid consecutively between adjacent zones until reaching an outlet of the cold plate from which the coolant fluid emerges. The cold plate 120 can be constructed of any suitable one or more metals (e.g., aluminum, copper, etc.) or other materials with sufficient thermal conductivity that provide suitable heat transfer to provide effective cooling to the underlying IC package. The cold plate 120 is also suitably dimensioned to cover the IC package 15 (e.g., the cold plate has length and width dimensions that are the same or greater than the length and width dimensions of the IC package).

Figure 2:
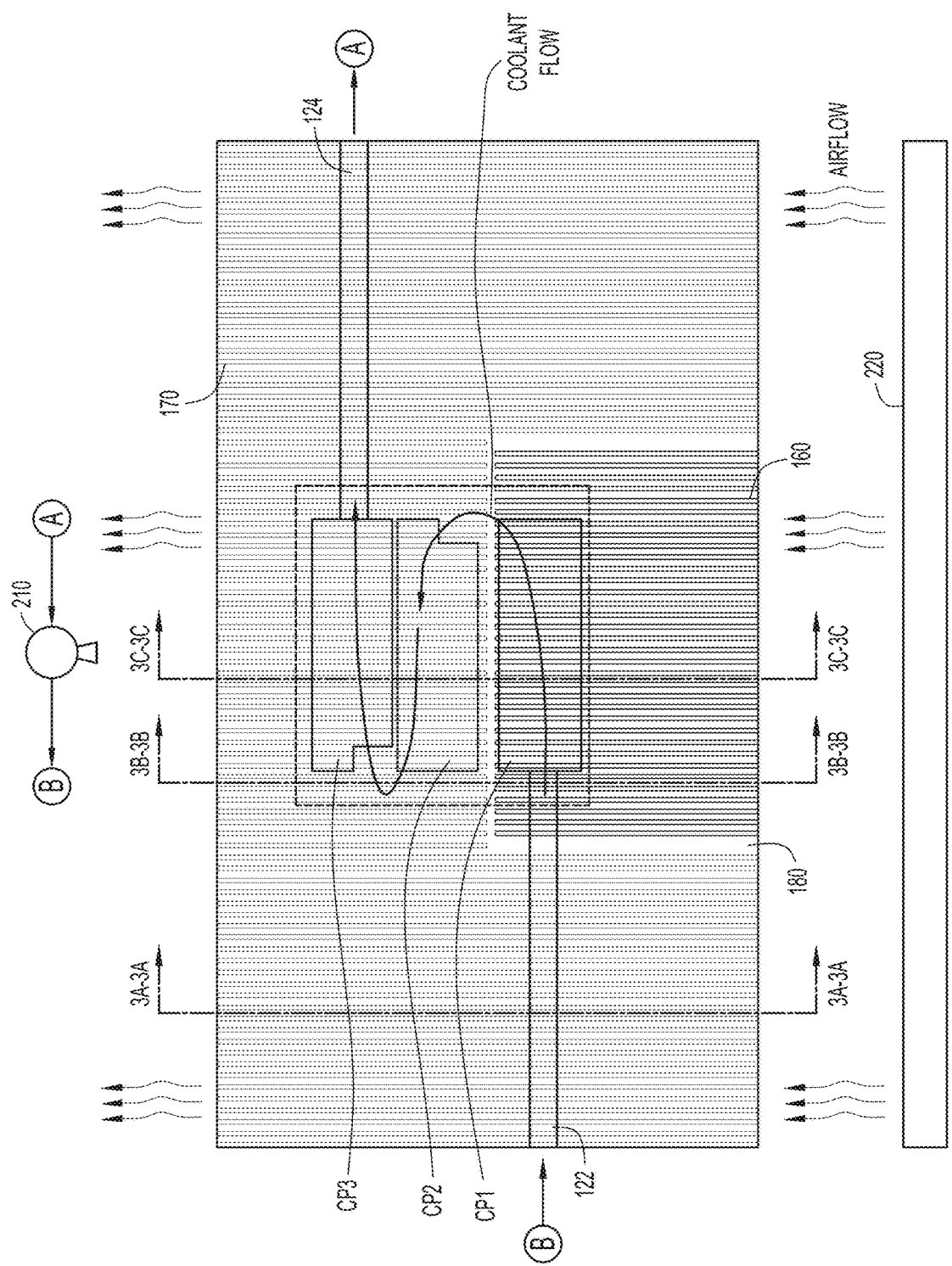
FIG. 2 is a top view in plan of the device with combined liquid and air cooling system in accordance with embodiments described herein.
Figure 4:
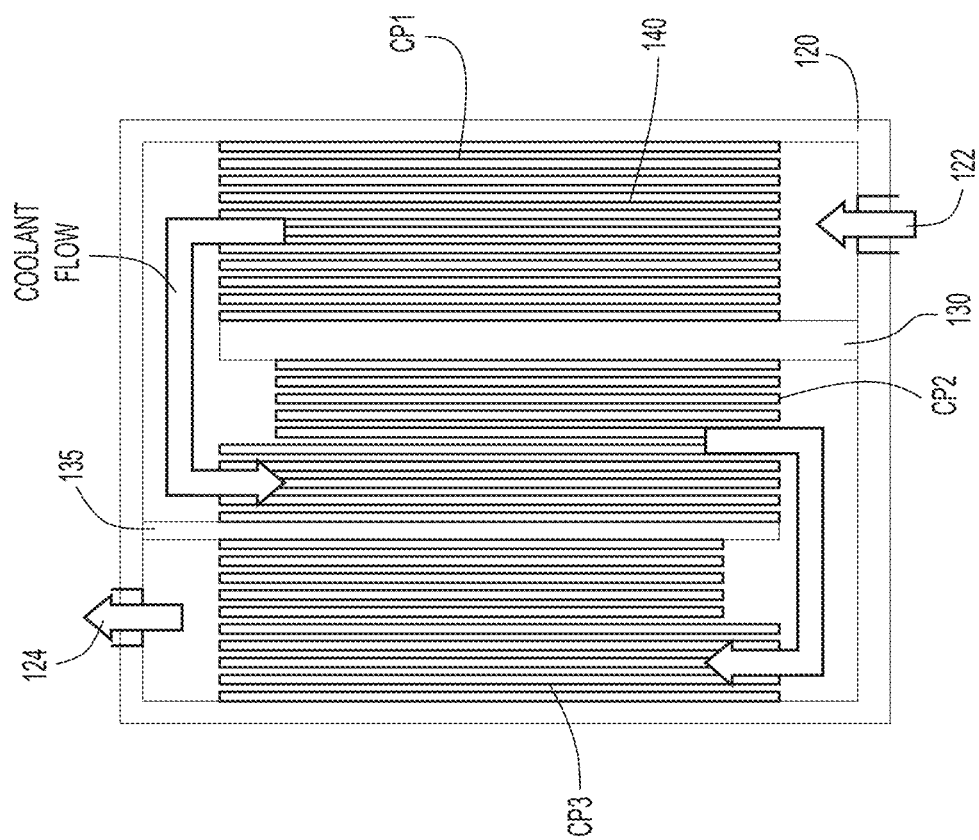
FIG. 4 is a top view in plan and partial cross-section of a portion of the device of FIG. 2 taken along lines 4-4 of FIG. 3C.
Figure 5:
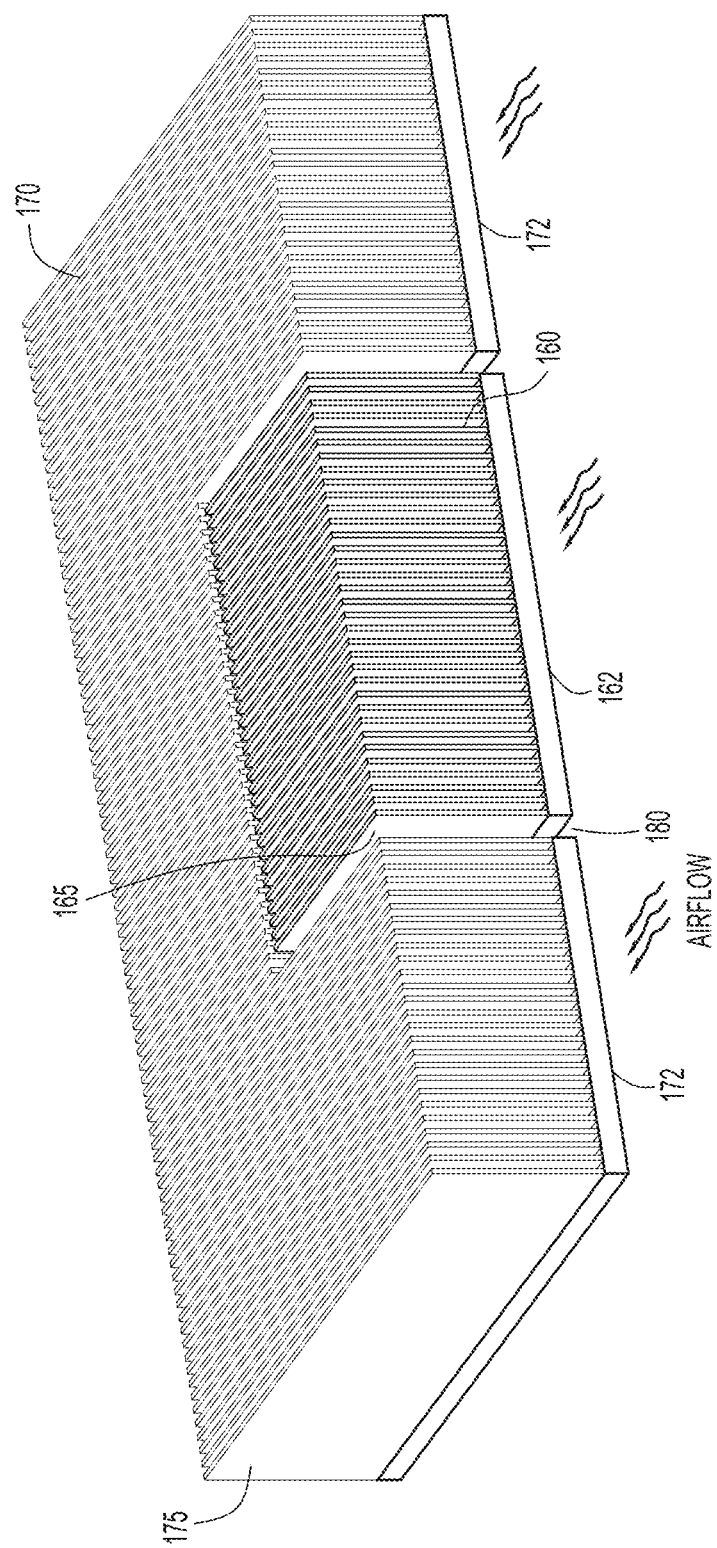
FIG. 5 is a view in perspective of the air cooling portion for the cooling system of the device of FIG. 2.

As shown in the top views of FIGS. 2 and 4 and the side view in partial cross section in 3B, the cold plate 120 includes a fluid inlet 122 that provides a flowing coolant fluid from a coolant fluid source (not shown) into the cold plate on one side of the cold plate housing and a fluid outlet 124 from which the coolant fluid exits the cold plate at another, opposing side of the cold plate housing. As shown by the arrows associated with the fluid inlet 122 and fluid outlet 124 in FIGS. 2 and 4, the coolant fluid is directed through the cold plate 120 and into adjacent cold plate zones at alternating directions so as to follow a looping and torturous or serpentine-like flow path through the cold plate.

In the example embodiment described herein, the cold plate 120 includes three cold plate (CP) zones. In particular, the cold plate 120 includes CP Zone 1 (also referred to and shown in the figures as CP1), CP Zone 2 (also referred to and shown in the figures as CP2) which is adjacent CP1, and CP Zone 3 (also referred to and shown in the figures as CP3) which is adjacent CP2 (i.e., CP2 is disposed between CP1 and CP3). The CP zones CP1, CP2 and CP3 are generally rectangular and aligned with each other in a side-by-side manner such that the coolant fluid flows in an alternate direction between adjacent CP zones (e.g., as depicted in the top views of FIGS. 2 and 4, coolant fluid flows from left to right in CP1, from right to left in CP2, and from left to right in CP3). In particular, the coolant fluid flows from the cold plate fluid inlet 122 into an inlet end of CP1, from an outlet end of CP1 to an inlet end of CP2 (where the inlet end of CP2 opposes the inlet end of CP1) and from an outlet end of CP2 into an inlet end of CP3 (where the inlet end of CP3 opposes the inlet end of CP2). The coolant fluid emerges from the outlet end of CP3 to the cold plate fluid outlet 124. During operation of the electronic device 2 in a normal operation mode as described herein and where liquid cooling of the IC package 15 is required, the coolant fluid flows into the cold plate fluid inlet 122 in a cold state or at a suitable temperature T1. This cold state temperature is lower than the temperature of the coolant fluid at the cold plate fluid outlet 124 which is in a hot state or at a temperature T2 (i.e., where T2>T1).

As depicted in the figures (e.g., FIG. 3B), the CP zones are aligned such that CP1 is located directly over the HBM modules 30 (HBM-1 and HBM-2) while CP2 and CP3 are aligned so as to be located directly over the DIE 20. Thus, CP1 is primarily arranged, structured and responsible to provide cooling to the HBM modules 30, while CP2 and CP3 are primarily arranged, structured and responsible to provide cooling to the ASIC DIE 20. In addition, CP1 can be physically separated from CP2 by providing a slit or gap 130 within the cold plate between CP1 and CP2 so as to thermally isolate CP1 from CP2 and CP3. For example, the gap 130 in the cold plate 120 is located between and can extend the length or substantially the length of each of CP1 and CP2. In addition, an internal separator 135 can also be provided between CP2 and CP3 (as shown, e.g., in FIG. 4) to facilitate the different flow path inlets and outlets for these adjacent cold plate zones.

Each enclosed CP zone includes a plurality of cooling fins 140 that are aligned in the direction of coolant flow through the CP zone (see FIGS. 3B, 3C and 4). In other words, a length dimension or the lengths of the fins 140 corresponds or is generally in parallel alignment with the length dimension of each CP zone. The fins are elongated to define a large surface area and large height to width ratio and can have any one or more suitable configurations (e.g., having a straight fin/uniform cross-section, a pointed fin/non-uniform cross-section, an annular fin, etc.). The fins can further be formed of any suitable metals (e.g., copper or aluminum) and/or other materials having a suitable thermal conductivity to facilitate effective heat transfer from the fins to the coolant fluid flowing through the CP zones during the normal operation mode of the device.

A different fin density can be provided in different CP zones. For example, in CP1 (located directly above the HBM modules 30), the fin density, measured in fins per inch (FPI), can be greater than the fin density in CP2 and/or CP3 (located directly above the DIE 20). In a specific embodiment, the fin density in CP1 is 1.5 times greater than the fin density in each of CP2 and CP3 (where the fin density is the same for each of CP2 and CP3). In an example embodiment, CP1 can include about 60 FPI, while each of CP2 and CP3 include about 42 FPI. The fins in each zone can have a suitable thickness to ensure adequate heat transfer between fins and coolant fluid for a particular application. In an example embodiment, the fin thickness of fins for each zone is about 6 mil (e.g., about 0.152 mm). Further, a length and/or height of a certain number of fins 140 in one or more of the CP zones can be cut or truncated at or near the fluid inlet to the CP zone in order to accommodate an entrance of fluid coolant flowing into and/or out of the CP zone. For example, as shown in FIGS. 2 and 4, some of the fins 140 at the inlet ends of CP2 and CP3 have their lengths truncated to facilitate an even or uniform flow of coolant fluid into and through each of these CP zones.

The liquid cooling system 110 with cold plate 120 can be structured so that the coolant fluid is circulated and recirculated in a closed recirculation loop through the liquid cooling system 110 (e.g., including a pump or compressor to move the fluid), where the closed recirculation loop includes the cold plate fluid inlet 122, cold plate fluid outlet 124 and the CP zones within the cold plate housing. A closed circulation loop is generally depicted in FIG. 2, in which a pump 210 provides a circulating coolant flow between the cold plate inlet and outlet (e.g., via conduits, connection members, fixtures, and/or any other types of fluid plumbing within the closed recirculation loop). The pump 210 can be located within the device 2 (e.g., proximate the PCB 10) or at any other suitable location. During normal operation mode, the coolant fluid emerging from the cold plate fluid outlet 124 is in a hot state at a temperature T2 and can be cooled utilizing air and/or any other suitable cooling cycle (e.g., condensation) process prior to being recirculated back to the cold plate fluid inlet 122. As described in further detail herein, the normal mode of operation occurs with circulating coolant fluid through the liquid cooling system 110 until a condition is detected, such as a detected condition that indicates occurrence of a leakage of coolant fluid from the closed recirculation loop. In the event of a fluid leakage, it is important to minimize or prevent damage to electrical components of the PCB 10 by the coolant fluid. The coolant fluid utilized for the liquid cooling system 110 can be a dielectric fluid, e.g., a hydrofluoroolefin (HFO) dielectric fluid such as that commercially available under the tradename R1234ze(Z) (Honeywell International Inc.). Such a dielectric fluid for the coolant fluid of the liquid cooling system can contact PCB electrical components with very little to no damage to the components (thus preventing repair or replacement of system components of the device when a coolant fluid leakage occurs).

The air cooling system 150, which is disposed over the liquid cooling system 110, comprises a plurality of heat sinks. The heat sinks are constructed of one or more metals (e.g., aluminum, copper, etc.) and/or any other materials that provide a suitable thermal conductivity for the heat sinks to effectively transfer heat away from components of the PCB to the surrounding ambient environment (i.e., to effectively cool the PCB components during normal operation of the device). Referring, e.g., to FIGS. 2, 3A-3C and 5, the air cooling system 150 includes a primary heat sink 170 and a secondary heat sink 160 which, in combination, have suitable length and width dimensions to extend over the IC package 15 as well as other components of the PCB 10. In particular, the heat sinks of the air cooling system can be suitably dimensioned such that the air cooling system extends over a majority of the area or footprint of the PCB. The primary heat sink 170 has a generally rectangular shape and includes a generally rectangular cut-out section configured such that the secondary heat sink 160 (also generally rectangular in shape) fits within the cut-out section. The secondary heat sink 160 and primary heat sink 170 are separated from each other (i.e., the secondary and primary heat sinks are not in contact with each other) such that a small space or gap 180 exists between the outer periphery of the secondary heat sink and an inner periphery of the primary heat sink defined by the cut-out section. The heat sinks are further aligned along the PCB such that the secondary heat sink 160 is disposed over the entire length by width area defined by CP1 for the cold plate 120 (where CP1 extends over the HBM modules 30, HBM-1 and HBM-2). The primary heat sink 170 surrounds but is physically separated (i.e., by the gap 180 therebetween) from the secondary heat sink 160 and has length by width dimensions that cover areas of the IC package 15 and PCB 10 including covering CP2 and CP3 of the cold plate 120. The gap 180 that exists between the primary heat sink 170 and secondary heat sink 160 is the same or similar and corresponds with a space or gap (e.g., gap 35 as shown in FIG. 1) that exists between the HBM modules 30 and DIE 20 of the IC package 15. In an example embodiment, the primary heat sink has the following dimensions: about 8.0 inch (about 20.3 cm) width by about 4.1 inch (about 10.4 cm) length by about 1.4 inch (about 3.56 cm) height (where length of the heat sink is defined as the dimension in which air flows through the heat sink). The secondary heat sink has the following dimensions: about 3.23 inch (about 8.20 cm) width by about 2.0 inch (about 5.08 cm) length by about 1.4 inch (about 3.56 cm) height. The height as well as other dimensions of the heat sinks can be designed so as to ensure the combined liquid and air or fail-safe cooling system 100 fits within a 1 RU high card.

Each heat sink 160, 170 includes an enclosed lower vapor chamber 162, 172 to achieve a sufficient thermal spreading and heat transfer between components of the PCB and the heat sink fins. In other words, the air cooling system 150 includes double vapor chamber heat sinks, where the vapor chamber 162 of the secondary heat sink 160 is separated and isolated from the other vapor chamber 172 of the primary heat sink 170. Disposed over and adjacent each vapor chamber are a plurality of cooling fins 165, 175 that are generally parallel with each other and with lengthwise dimensions extending in a direction that generally corresponds with (i.e., is generally parallel with) a direction of airflow passing through the arrangement of fins. The fins are elongated to define a large surface area and large height to width ratio and can have any one or more suitable configurations (e.g., having a straight fin/uniform cross-section, a pointed fin/non-uniform cross-section, an annular fin, etc.). As depicted in the figures, the fins 65, 175 of the heat sinks 160, 170 and direction of air flow through the heat sinks are transverse (e.g., perpendicular) a direction of the fins 140 and direction of coolant fluid flow through CP1, CP2 and CP3 of the cold plate 120. An airflow device 220 is schematically depicted in FIG. 2 and shows a direction of airflow through the primary and secondary heat sinks. The airflow device 220 can be located within the housing of the device 2 and can comprise one or more fans having variable operating speeds such that the airflow device is capable of directing direct cooling air at two or more different airflow rates through each heat sink in the direction shown in the figures (e.g., toward a lengthwise side of the heat sinks 160, 170, which is transverse the direction of coolant flow through the cold plate 120). A suitable controller or processor can be provided (e.g., as a component integrated with the PCB 10 or provided external to the PCB and/or device) that controls operation of the airflow device 220 at varying airflow speeds during operation of the device 2 as described herein.

Figure 6:
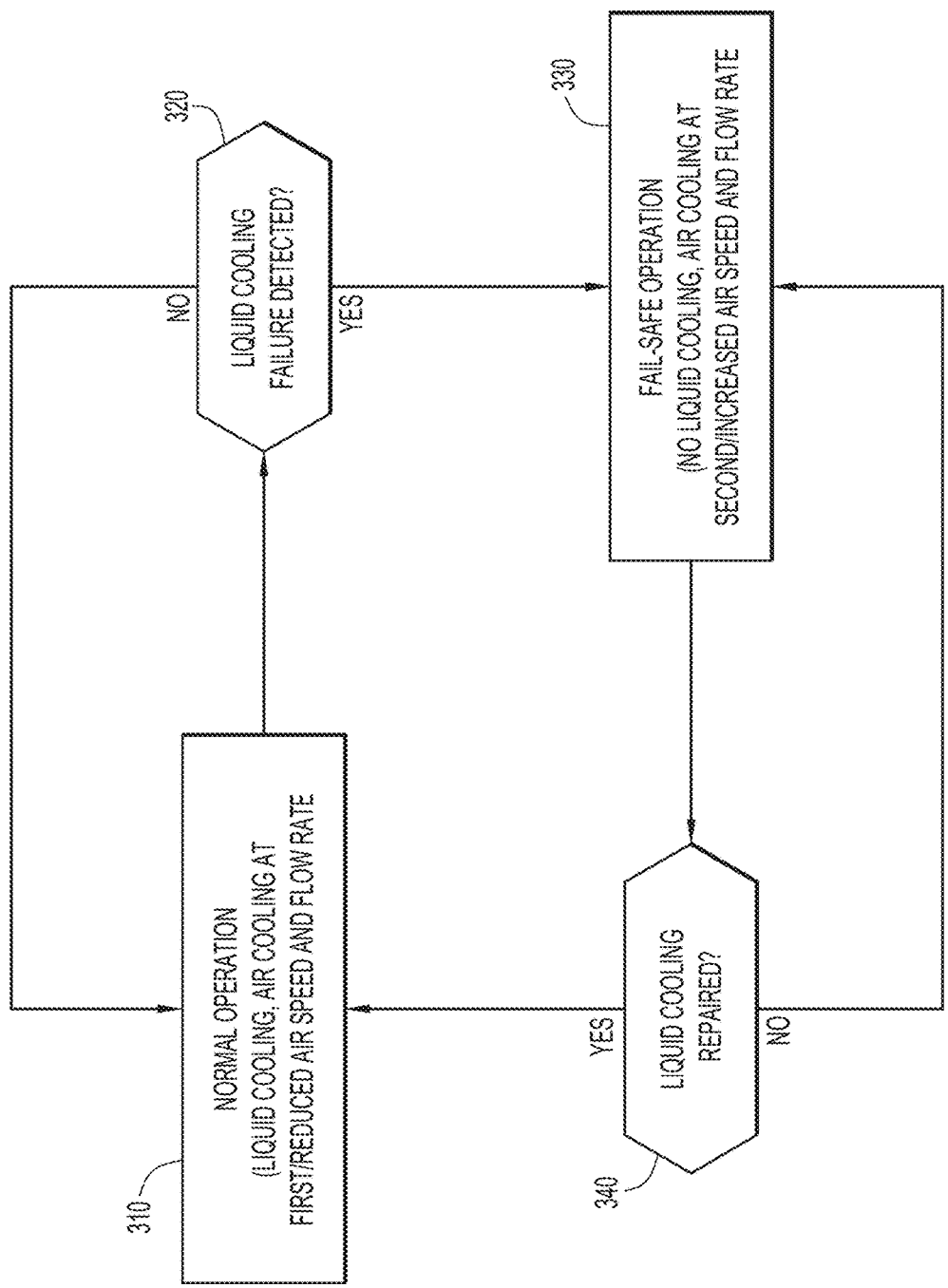
FIG. 6 is a flowchart showing methods of operation of the combined liquid and air cooling system of FIG. 2 with cooling performed in normal and fail-safe operation modes in accordance with embodiments described herein.

Operation of the fail-safe cooling system 100 is now described with reference to FIG. 6. System operation including the operational steps as described herein can be performed, e.g., in an automated manner (e.g., via automated control of both the liquid cooling system 110 and the air cooling system 150 with a processor or controller). During operation of the device, electronic components of the PCB within the device require cooling to ensure adequate performance over extended time periods. The fail-safe cooling system 100 includes two modes of operation: a first or normal operation mode (during normal operating conditions) and a second or fail-safe operation mode (when a condition is detected that indicates cooling system is not operating in a normal manner).

Figure 7A:
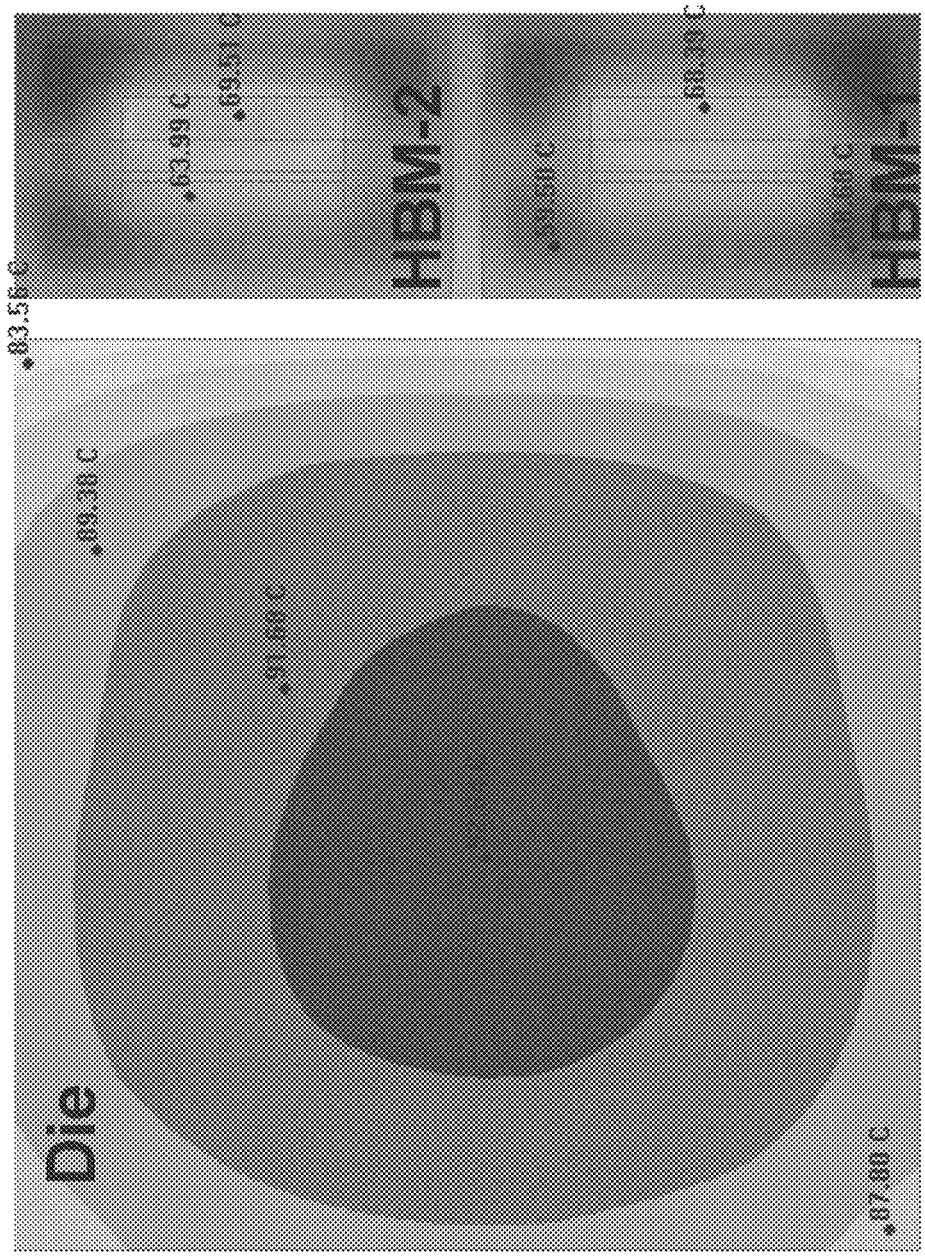
FIGS. 7A and 7B show temperature distribution of the ASIC die, HBM-1 and HBM-2 of the device of FIG. 2 during normal operation and fail safe modes utilizing the method as depicted in the flowchart of FIG. 6.

At 310, the fail-safe cooling system 100 is operating in the first or normal operation mode in which both the liquid cooling system 110 and the air cooling system 150 operate to cool the IC package 15 as well as other components of the PCB 10 of the device 2. In the normal operation mode, the ASIC DIE 20 is typically less than about 110° C. (e.g., about 92° C.) and the temperature of one or both HBM modules 30 is less than 95° C. (e.g., about 70° C.). Coolant fluid is circulated at a selected flow rate through the closed coolant flow system (e.g., utilizing pump 210) and through the CP zones (CP1, CP2, CP3) of the cold plate 120 to cool the ASIC, HBM modules and any other components of the IC package 15. In an example embodiment, the liquid cooling system 110 provides a coolant fluid flow through the cold plate 120 at a flow rate of no greater than about 0.3 gallons per minute (GPM) (about 1.14 liters per minute (LPM)) and a pressure drop (DP) of less than about 1.0 psi (about 6.89 kPa). In the first or normal operation mode (in which long term or normal parameters are applied), the airflow device 220 (e.g., one or more cooling fans) of the air cooling system 150 operates to provide airflow at a first speed or first flow rate that is less than a second or maximum flow rate at which airflow can be provided. For example, in the normal operation mode the airflow device can provide airflow through the primary heat sink 170 and secondary heat sink 160 at a first flow rate that is no greater than about 50% (e.g., no greater than about 30%) of the maximum flow rate at which airflow can be provided by the airflow device. Further, in this first or normal operation mode, the liquid cooling system 110 primarily cools the IC package components (including the ASIC and ASIC die, and the HBM components), while the air cooling system 150 primarily cools other components of the PCB (e.g., optics components, retimers and/or any other types of electronic components of the PCB). Temperature distribution data for the ASIC die and HBM modules in the normal operation mode is shown in FIG. 7A (using R1234ze (Z) dielectric fluid as the coolant, provided at a flow rate of 0.3 GPM, airflow device comprising one or more fans operating at a fan speed that is 30% of maximum operating speed, e.g., about 40 cubic feet per minute (CFM), and ambient temperature is at about 40° C.), with the ASIC operating with about 490 W power dissipation and each of HBM-1 and HBM-2 operating with about 20 W power dissipation (for a total of about 530 W of power dissipation). At the normal mode of operation and under these conditions, the ASIC die is maintained at a temperature of no greater than about 92° C. (maximum temperature of 92.64° C.), while each HBM module is maintained at a temperature of no greater than about 70° C. (maximum temperatures of 68.39° C. for HBM-1 and 69.51° C. for HBM-2).

At 320, the liquid cooling system is periodically checked (checked at selected intervals) to determine whether a coolant fluid leak has occurred (e.g., leak occurring at the pump 210 or anywhere along the circulation lines between the cold plate fluid inlet 122 and cold plate fluid outlet 124). The fail-safe cooling system 100 can include any suitable sensors located at any one or more suitable locations within the device 2 that provide an indication of a coolant leakage. For example, any one or more temperature sensors can be provided at or near the DIE 20, HBM modules 30 and/or any other electrical components of the PCB 10, where the temperature sensor(s) provide temperature measurements at such location(s) in order to detect whether the liquid cooling system is not operating properly due to a coolant leakage (e.g., based upon an increase in measured temperature that exceeds a predetermined threshold value). Alternatively (or in addition to providing one or more temperature sensors), one or more pressure sensors and/or flow rate sensors can be provided at or proximate the pump 210 and/or at other locations within the closed circulation loop for the coolant fluid of the liquid cooling system 110, where such pressure and/or flow rate sensors provide a measurement of a pressure differential or a flow rate of coolant fluid through the coolant fluid recirculation loop. For example, a sudden rise in temperature beyond a desired level or predetermined threshold value (e.g., temperature at ASIC die exceeds 110° C. and/or temperature at HBM modules exceeds 95° C.) and/or a certain measured pressure or pressure differential within the coolant fluid loop can provide an indication that a coolant fluid leak has occurred or is occurring.

If no coolant fluid leak is detected, the process remains in the normal mode of operation (i.e., the process proceeds from 320 back to 310). If, however, a coolant fluid leak is detected, the process changes to a fail-safe mode of operation at 330. In the fail-safe mode of operation (in which short term parameters are applied), circulation of the coolant fluid is stopped (e.g., pump/compressor is turned off or shut down) and the flow rate of the airflow device 220 for the air cooling system 150 is increased (e.g., the fan speed of one or more fans of the airflow device 220 is increased) such that the airflow is increased to a second flow rate (e.g., a maximum flow rate or 100% operational speed for the one or more fans). This in turn increases the airflow through the heat sinks of the air cooling system (e.g., increase of airflow to as great as about 133 CFM).

Figure 7B:
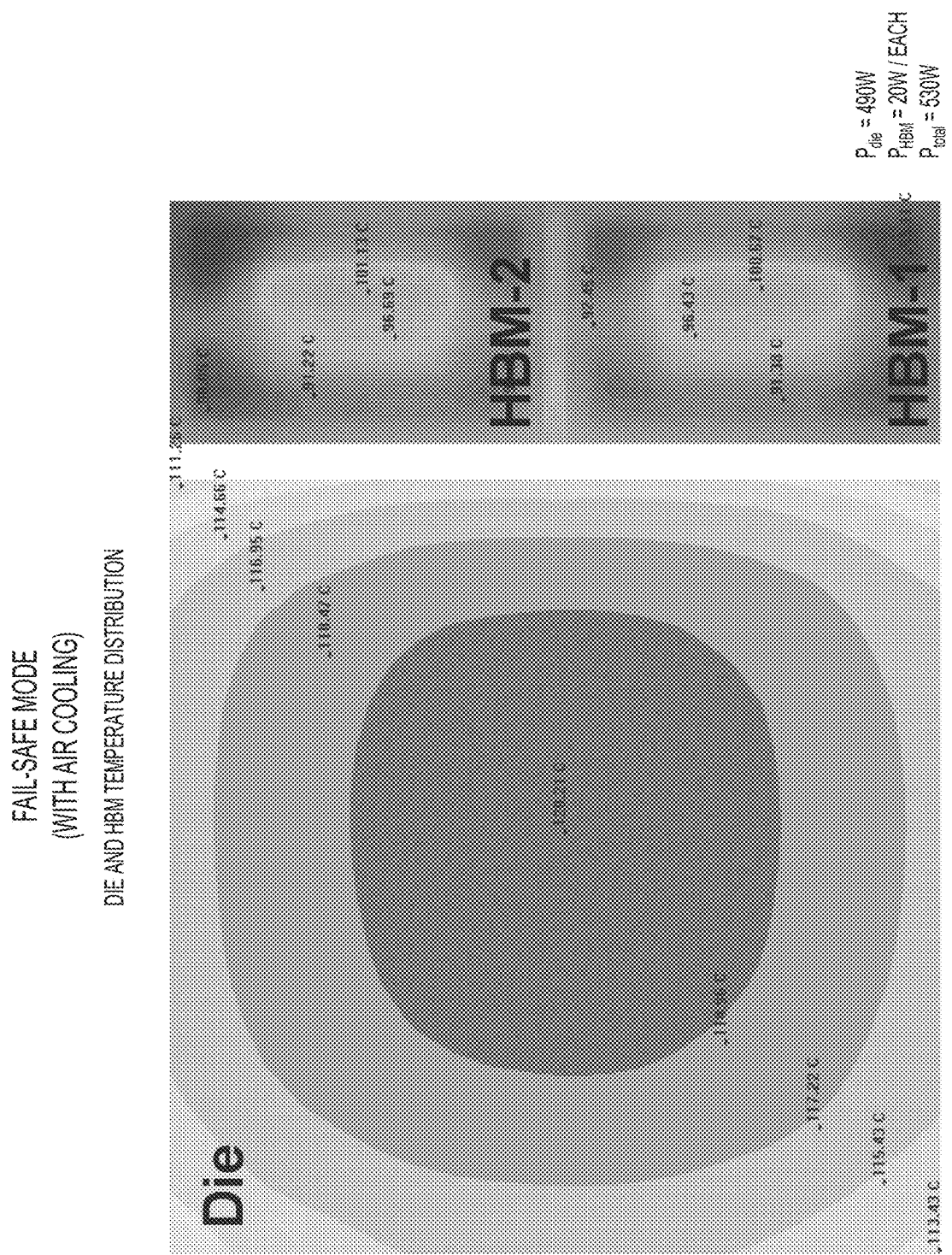

In the fail-safe mode, temperatures of the ASIC DIE 20 and HBM modules 30 will increase relative to the normal operation mode. However, due to the increase in flow rate of cooling air provided by the air cooling system 150, increases in the ASIC and HBM temperatures can be effectively controlled so as to not exceed certain maximum allowable values. For example, ASIC die temperatures, while increasing in the fail-safe mode, can be controlled or maintained so as to not exceed about 125° C. (e.g., maintained at or below about 120° C.), and HBM module temperatures can be controlled or maintained so as to not exceed about 105° C. (e.g., maintained at or below about 101° C.). FIG. 7B depicts a temperature distribution of the ASIC die and HBM modules during the fail-safe mode of operation (at ambient temperature of about 40° C., fan speed of the one or more fans for the airflow device operating at 100%, e.g., so as to provide a flow rate of air of about 133 CFM). While these increased temperatures are not optimal, they are still maintained within an acceptable or tolerable level for adequate performance of the device 2.

At 340, it is determined (e.g., manually or automatically) whether the leak has been repaired in the coolant fluid recirculation loop of the liquid cooling system 110 (e.g., based upon measured temperatures or measured pressures from the sensors provide an indication that the coolant fluid is no longer leaking and the liquid cooling system 110 is operating properly). The process remains in the fail-safe operation mode at 330 until such time as it has been determined that the leak has been repaired, at which time the process returns to the normal mode of operation at 310. The process can then be repeated as often as needed, switching between normal and fail-safe modes of operation, during use of the device 2.

Thus, the fail-safe cooling system 100 that combines liquid cooling with air cooling can effectively maintain cooling of the IC package and other components of the PCB utilizing the air cooling system 150 to permit continuous and uninterrupted performance of the device 2 while the liquid cooling system 110 is down or brought offline for maintenance and repair (including repair of any coolant leakage from the closed loop recirculation). For example, if the liquid cooling system 110 for a high power density ASIC fails, the device is still able to sustain its operation due to the air cooling portion or component of the combined liquid and air cooling system boosting the heat exchange/cooling during liquid cooling system failure. While the temperatures of the ASIC die and HBM modules increase during the fail-safe mode (during cooling system failure, as indicated in the example thermal diagrams of FIGS. 7A and 7B), the apparatus or device can sustain operations with no intermittency while the liquid cooling system is brought offline for maintenance/repair for a short inactive time period since the increased temperatures are still maintained within tolerance levels for the device during such time period.

The fail-safe mode for the combined liquid and air cooling system is also operable to increase airflow via the airflow device (e.g., via one or more fans) to the heat sinks in response to any condition that may require greater cooling and heat transfer from the ASIC die and HBM modules during operation of the device. In other words, in certain applications, system operation may be configured such that the fail-safe mode can be initiated or triggered even when there is no coolant leakage. For example, other circumstances may occur where the liquid cooling system is not functioning properly which may trigger a switch from the normal mode of operation to the fail safe mode of operation. Any condition in which coolant fluid is not circulating within the liquid cooling system during the normal mode of operation, such as a pump failure, a plug in the closed recirculation loop for the coolant fluid that limits or prevents flow of coolant fluid, etc., can be detected, e.g., via pressure and/or flow rate measurements at the pump and/or at any other locations along the closed recirculation loop. When a detection of the condition occurs (e.g., a measured coolant fluid flow rate drops below a threshold value at one or more locations within the closed recirculation loop, or a measured pressure value or pressure drop at the pump changes to a value that indicates pump failure or the pump is operating improperly), the process is switched from the normal mode to the fail-safe mode of operation until such time as the liquid cooling system is repaired or corrected to operate adequately and properly for the normal mode.

The combined liquid and air or fail-safe cooling system is particularly effective for a PCB including an IC package having a 2.5 D ASIC configuration where, during device operations, the IC package dissipates about 530 W (490 W dissipated by the ASIC die, 20 W dissipated for each HBM). Further, the fail-safe cooling system can effectively cool multiple ASIC arrangements on a PCB, including a multiple ASIC arrangement in parallel on a 1 RU card. For example, the fail-safe cooling system can effectively cool two assemblies side-by-side in the transverse direction to the airflow on a typical 17" networking line card. In addition, the fail-safe cooling system can effectively cool three ASICs utilizing the pressure drop and flow rates for the coolant in the liquid cooling system as noted herein, and with a total liquid flow rate limited to 1.0 GPM and with a total power dissipation on the card as great as 2000 W.

The combined liquid and air or fail-safe cooling system can operate in extreme and/or adverse conditions (e.g., high temperature ambient environments, utilizing a low conductivity fluid for the coolant, etc.) and still perform effectively to cool components of the electronic device within tolerable levels. The system can also operate under low pressure drop, e.g., less than about 1.0 psi (about 6.89 kPa), and low flow rate conditions, e.g., less than about 1.0 GPM (about 3.8 LPM), such as no greater than about 0.3 GPM (about 1.14 LPM), while still effectively cooling components of the IC package.

Thus, an example embodiment of an apparatus comprises an integrated circuit package comprising a plurality of components including an application specific integrated circuit (ASIC) die and a plurality of high bandwidth memory (HBM) modules. The apparatus further comprises a combined liquid and air cooling system to cool components of the integrated circuit package. The combined liquid and air cooling system comprises a liquid cooling system comprising a cold plate located over the ASIC die and the HBM modules, where the liquid cooling system further comprises a closed recirculation loop that circulates a coolant fluid through the cold plate to provide cooling to the ASIC die and HBM modules, and an air cooling system integrated with the liquid cooling system, where the air cooling system comprises a heat sink and an airflow device that directs a flow of air through the heat sink to cool components of the integrated circuit package.

The cold plate of the liquid cooling system can be divided into a plurality of cold plate (CP) zones, each CP zone including an inlet to receive the coolant fluid into the CP zone and an outlet to direct the coolant fluid from the CP zone, and the outlet of a first CP zone is oriented to direct the coolant fluid from the first CP zone into the inlet of a second CP zone such that the coolant fluid flows in opposing directions through the first CP zone and the second CP zone.

The first CP zone can be located over the HBM modules, and the second CP zone can be located over the ASIC die, and the first CP zone is separated from the second CP zone by a gap within the cold plate that extends a length of each of the first and second CP zones.

The outlet of the second CP zone can be oriented to direct the coolant fluid from the second CP zone into the inlet of a third CP zone such that the coolant fluid flows in opposing directions through the second CP zone and the third CP zone.

Each CP zone can include a plurality of fins having lengths that extend in a direction of coolant fluid flow through each CP zone such that the coolant fluid flowing within the closed recirculation loop flows around and along the lengths of the fins. The first CP zone can have a fin density that is greater than a fin density of the second CP zone.

The heat sink of the air cooling system can be divided into a primary heat sink and a secondary heat sink spaced apart from the primary heat sink, the secondary heat sink being located over the first CP zone of the liquid cooling system, and the primary heat sink being located over the second and third CP zones of the liquid cooling system.

The airflow device of the air cooling system can direct the flow of air through the heat sink in a first direction that is transverse to a second direction of coolant fluid flow through the cold plate, and the heat sink can further comprise fins having lengths that are oriented in the heat sink such that the flow of air directed through the air cooling system passes around and along the lengths of the fins of the air cooling system.

The airflow device of the air cooling system can be operable to direct the flow of air through the air cooling system at a first flow rate during a first mode of operation when the liquid cooling system directs the coolant fluid through the cold plate, and the airflow device can further be operable to direct the flow of air through the air cooling system at a second flow rate during a second mode of operation when the liquid cooling system stops directing the coolant fluid through the cold plate, and the second flow rate is greater than the first flow rate.

In another embodiment, an electronic device comprises a printed circuit board (PCB), and an integrated circuit package integrated with the PCB, where the integrated circuit package comprises a plurality of components including an application specific integrated circuit (ASIC) die and a plurality of high bandwidth memory (HBM) modules, and a combined liquid and air cooling system to cool components of the integrated circuit package. The combined liquid and air cooling system comprises a liquid cooling system comprising a cold plate located over the ASIC die and the HBM modules, where the liquid cooling system further comprises a closed recirculation loop that circulates a coolant fluid through the cold plate to provide cooling to the ASIC die and HBM modules, and an air cooling system integrated with the liquid cooling system, where the air cooling system comprises a heat sink and an airflow device that directs a flow of air through the heat sink to cool components of the integrated circuit package.

In a further embodiment, a method comprises providing a combined liquid and air cooling system over a printed circuit board (PCB) of an electronic device, the PCB including a plurality of components including an integrated circuit package, the integrated circuit package comprising an application specific integrated circuit (ASIC) die and a plurality of high bandwidth memory (HBM) modules, and the combined liquid and air cooling system comprising a liquid cooling system located over the integrated circuit package and an air cooling system integrated with the liquid cooling system and a portion of the PCB. In a first mode of operation, a flow of a coolant fluid is provided within a closed recirculation loop and through a cold plate of the liquid cooling system to cool the ASIC die and HBM modules of the integrated circuit package during operation of the electronic device. A flow of air is directed, via an airflow device of the air cooling system, at a first flow rate through a heat sink of the air cooling system to cool components of the PCB.

In response to a detected condition, the method can further comprise switching from the first mode of operation to a second mode of operation, where the second mode of operation comprises directing, via the airflow device of the air cooling system, a flow of air at a second flow rate through the heat sink of the air cooling system, where the second flow rate is greater than the first flow rate. The detected condition can comprise a detection of a coolant fluid leakage within the closed recirculation loop of the liquid cooling system.

The second mode of operation can further comprise stopping the flow of coolant fluid within the closed recirculation loop and, in response to a determination that the coolant fluid leakage within the closed recirculation loop has been repaired, switching from the second mode of operation to the first mode of operation.

The detected condition can be determined by obtaining a measurement selected from the group consisting of a measured temperature at the ASIC die and/or at an HBM module of the integrated circuit package, measurement of a flow rate within the closed recirculation loop of the liquid cooling system, and measurement of a pressure within the closed recirculation loop of the liquid cooling system.

The detected condition can be determined by obtaining a measured temperature at the ASIC die and/or at an HBM module, and the first mode of operation is switched to the second mode of operation in response to the measured temperature exceeding a threshold value.

In response to a determination that the measured temperature decreases to a value that is below the threshold value, the method can further comprise switching from the second mode of operation to the first mode of operation.

The cold plate of the liquid cooling system can be divided into a plurality of cold plate (CP) zones, each CP zone including an inlet to receive the coolant fluid into the CP zone and an outlet to direct the coolant fluid from the CP zone, and coolant fluid can be provided in the first mode of operation from the outlet of a first CP zone into the inlet of a second CP zone such that the coolant fluid flows in opposing directions through the first CP zone and the second CP zone.

The first CP zone can be located over the HBM modules, and the second CP zone can be located over the ASIC die, and the first CP zone can be separated from the second CP zone by a gap within the cold plate that extends a length of each of the first and second CP zones such that, in the first mode of operation, the first CP zone provides cooling to the HBM modules and the second CP zone provides cooling to the ASIC die.

The airflow device of the air cooling system can direct the flow of air through the heat sink in a first direction that is transverse a second direction of coolant fluid flow through the cold plate, and the heat sink can further comprise fins having lengths that are oriented in the heat sink such that the flow of air directed through the air cooling system passes around and along the lengths of the fins of the air cooling system.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
providing a combined liquid and air cooling system over a printed circuit board (PCB) of an electronic device, the PCB including a plurality of components including an integrated circuit package and at least one other component, the integrated circuit package comprising an application specific integrated circuit (ASIC) die and a plurality of high bandwidth memory (HBM) modules, and the combined liquid and air cooling system comprising a liquid cooling system located over the integrated circuit package and an air cooling system integrated with the liquid cooling system and a portion of the PCB; and
in a first mode of operation:
providing a flow of a coolant fluid within a closed recirculation loop and through a cold plate of the liquid cooling system to cool the ASIC die and the plurality of HBM modules of the integrated circuit package during operation of the electronic device; and
directing, via an airflow device of the air cooling system, a flow of air at different flow rates through a plurality of heat sinks of the air cooling system to cool the plurality of components of the PCB, wherein a direction of the flow of air through the plurality of heat sinks at the different flow rates is transverse to a direction of the flow of the coolant fluid, wherein the combined liquid and air cooling system utilizes the air cooling system to cool the at least one other component.

2. A method comprising:
providing a combined liquid and air cooling system over a printed circuit board (PCB) of an electronic device, the PCB including a plurality of components including an integrated circuit package and at least one other component, the integrated circuit package comprising an application specific integrated circuit (ASIC) die and a plurality of high bandwidth memory (HBM) modules, and the combined liquid and air cooling system comprising a liquid cooling system located over the integrated circuit package and an air cooling system integrated with the liquid cooling system and a portion of the PCB;
in a first mode of operation:
providing a flow of a coolant fluid within a closed recirculation loop and through a cold plate of the liquid cooling system to cool the ASIC die and HBM modules of the integrated circuit package during operation of the electronic device; and
directing, via an airflow device of the air cooling system, a flow of air at a first flow rate through a heat sink of the air cooling system to cool the plurality of components of the PCB, wherein the combined liquid and air cooling system utilizes the air cooling system to cool the at least one other component;
identifying a detected condition in the liquid cooling system; and
in response to the detected condition, switching from the first mode of operation to a second mode of operation, the second mode of operation comprising:
directing, via the airflow device of the air cooling system, a flow of air at a second flow rate through the heat sink of the air cooling system, wherein the second flow rate is greater than the first flow rate.

3. The method of claim 2, wherein the detected condition comprises a detection of a coolant fluid leakage within the closed recirculation loop of the liquid cooling system.

4. The method of claim 3, wherein the second mode of operation further comprises:
stopping the flow of coolant fluid within the closed recirculation loop; and
in response to a determination that the coolant fluid leakage within the closed recirculation loop has been repaired, switching from the second mode of operation to the first mode of operation.

5. The method of claim 2, wherein the detected condition is determined by obtaining a measurement that is selected from the group consisting of a measured temperature at the ASIC die and/or at an HBM module of the integrated circuit package, measurement of a flow rate within the closed recirculation loop of the liquid cooling system, and measurement of a pressure within the closed recirculation loop of the liquid cooling system, wherein the liquid cooling system does not cool the at least one other component.

6. The method of claim 2, wherein the detected condition is determined by obtaining a measured temperature at the ASIC die and/or at an HBM module, and the first mode of operation is switched to the second mode of operation in response to the measured temperature exceeding a threshold value.

7. The method of claim 6, further comprising:
in response to a determination that the measured temperature decreases to a value that is below the threshold value, switching from the second mode of operation to the first mode of operation.

8. The method of claim 2, wherein the cold plate of the liquid cooling system is divided into a plurality of cold plate (CP) zones, each CP zone including an inlet to receive the coolant fluid into the CP zone and an outlet to direct the coolant fluid from the CP zone, and coolant fluid is provided in the first mode of operation from the outlet of a first CP zone into the inlet of a second CP zone such that the coolant fluid flows in opposing directions through the first CP zone and the second CP zone.

9. The method of claim 2, wherein the airflow device of the air cooling system directs the flow of air through the heat sink in a first direction that is transverse a second direction of coolant fluid flow through the cold plate, and the heat sink further comprises fins having lengths that are oriented in the heat sink such that the flow of air directed through the air cooling system passes around and along the lengths of the fins of the air cooling system.

10. A method comprising:
providing a combined liquid and air cooling system over a printed circuit board (PCB) of an electronic device, the PCB including a plurality of components including an integrated circuit package, the integrated circuit package comprising an application specific integrated circuit (ASIC) die and a plurality of high bandwidth memory (HBM) modules, and the combined liquid and air cooling system comprising a liquid cooling system located over the integrated circuit package and an air cooling system integrated with the liquid cooling system and a portion of the PCB;
in a first mode of operation:
providing a flow of a coolant fluid within a closed recirculation loop and through a cold plate of the liquid cooling system to cool the ASIC die and HBM modules of the integrated circuit package during operation of the electronic device;
directing, via an airflow device of the air cooling system, a flow of air at a first flow rate through a heat sink of the air cooling system to cool components of the PCB; and
in response to a detected condition, switching from the first mode of operation to a second mode of operation, the second mode of operation comprising:
directing, via the airflow device of the air cooling system, a flow of air at a second flow rate through the heat sink of the air cooling system, wherein the second flow rate is greater than the first flow rate, wherein the cold plate of the liquid cooling system is divided into a plurality of cold plate (CP) zones, each CP zone including an inlet to receive the coolant fluid into the CP zone and an outlet to direct the coolant fluid from the CP zone, and coolant fluid is provided in the first mode of operation from the outlet of a first CP zone into the inlet of a second CP zone such that the coolant fluid flows in opposing directions through the first CP zone and the second CP zone, and wherein the first CP zone is located over the HBM modules, and the second CP zone is located over the ASIC die, and the first CP zone is separated from the second CP zone by a gap within the cold plate that extends a length of each of the first and second CP zones such that, in the first mode of operation, the first CP zone provides cooling to the HBM modules and the second CP zone provides cooling to the ASIC die.

11. A method comprising:
in a first mode operation:
providing a flow of a coolant fluid within a closed recirculation loop and through a cold plate of a liquid cooling system located over an integrated circuit package that includes an integrated circuit die to cool the integrated circuit die and memory modules of the integrated circuit package during operation of an electronic device; and
directing, via an airflow device of an air cooling system arranged over a printed circuit board (PCB) of the electronic device, a flow of air at different flow rates through a plurality of heat sinks of the air cooling system to cool components of the PCB including the integrated circuit die, the memory modules, and at least one additional component wherein a direction of the flow of air through the plurality of heat sinks at the different flow rates is transverse to a direction of the flow of the coolant fluid.

12. A method comprising:
in a first mode operation:
providing a flow of a coolant fluid within a closed recirculation loop and through a cold plate of a liquid cooling system located over an integrated circuit package that includes an integrated circuit die to cool the integrated circuit die and memory modules of the integrated circuit package during operation of an electronic device; and
directing, via an airflow device of an air cooling system arranged over a printed circuit board (PCB) of the electronic device, a flow of air at a first flow rate through a heat sink of the air cooling system to cool components of the PCB including the integrated circuit die, the memory modules, and at least one additional component;
identifying a detected condition in the liquid cooling system; and
in response to the detected condition, switching from the first mode of operation to a second mode of operation, the second mode of operation comprising:
directing, via the airflow device of the air cooling system, a flow of air at a second flow rate through the heat sink of the air cooling system, wherein the second flow rate is greater than the first flow rate.

13. The method of claim 12, wherein the detected condition comprises a detection of a coolant fluid leakage within the closed recirculation loop of the liquid cooling system, and wherein the liquid cooling system is not arranged to cool the at least one additional component.

14. The method of claim 13, wherein the second mode of operation further comprises:
stopping the flow of coolant fluid within the closed recirculation loop; and
in response to a determination that the coolant fluid leakage within the closed recirculation loop has been repaired, switching from the second mode of operation to the first mode of operation.

15. The method of claim 12, wherein the detected condition is determined by obtaining a measurement that is selected from the group consisting of a measured temperature at the integrated circuit die and/or at an memory module of the integrated circuit package, measurement of a flow rate within the closed recirculation loop of the liquid cooling system, and measurement of a pressure within the closed recirculation loop of the liquid cooling system.

16. The method of claim 12, wherein the detected condition is determined by obtaining a measured temperature at the integrated circuit die and/or at an memory module, and the first mode of operation is switched to the second mode of operation in response to the measured temperature exceeding a threshold value.

17. The method of claim 16, further comprising:
in response to a determination that the measured temperature decreases to a value that is below the threshold value, switching from the second mode of operation to the first mode of operation.

18. The method of claim 12, wherein the cold plate of the liquid cooling system is divided into a plurality of cold plate (CP) zones, each CP zone including an inlet to receive the coolant fluid into the CP zone and an outlet to direct the coolant fluid from the CP zone, and coolant fluid is provided in the first mode of operation from the outlet of a first CP zone into the inlet of a second CP zone such that the coolant fluid flows in opposing directions through the first CP zone and the second CP zone.

19. The method of claim 12, wherein the airflow device of the air cooling system directs the flow of air through the heat sink in a first direction that is transverse a second direction of coolant fluid flow through the cold plate, and the heat sink further comprises fins having lengths that are oriented in the heat sink such that the flow of air directed through the air cooling system passes around and along the lengths of the fins of the air cooling system.

20. A method comprising:
in a first mode of operation:
providing a flow of a coolant fluid within a closed recirculation loop and through a cold plate of the liquid cooling system to cool the ASIC die and HBM modules of the integrated circuit package during operation of the electronic device;
directing, via an airflow device of the air cooling system, a flow of air at a first flow rate through a heat sink of the air cooling system to cool components of the PCB; and
in response to a detected condition, switching from the first mode of operation to a second mode of operation, the second mode of operation comprising:
directing, via the airflow device of the air cooling system, a flow of air at a second flow rate through the heat sink of the air cooling system, wherein the second flow rate is greater than the first flow rate, wherein the cold plate of the liquid cooling system is divided into a plurality of cold plate (CP) zones, each CP zone including an inlet to receive the coolant fluid into the CP zone and an outlet to direct the coolant fluid from the CP zone, and coolant fluid is provided in the first mode of operation from the outlet of a first CP zone into the inlet of a second CP zone such that the coolant fluid flows in opposing directions through the first CP zone and the second CP zone, and wherein the first CP zone is located over the memory modules, and the second CP zone is located over the integrated circuit die, and the first CP zone is separated from the second CP zone by a gap within the cold plate that extends a length of each of the first and second CP zones such that, in the first mode of operation, the first CP zone provides cooling to the memory modules and the second CP zone provides cooling to the integrated circuit die.

* * * * *